United States Patent
Koo et al.

(10) Patent No.: US 12,464,736 B2
(45) Date of Patent: Nov. 4, 2025

(54) SEMICONDUCTOR DEVICE WITH DIGITAL ISOLATOR CAPACITOR AND MANUFACTURING METHOD THEREOF

(71) Applicant: SK keyfoundry Inc., Cheongju-si (KR)

(72) Inventors: Sang Geun Koo, Cheongju-si (KR); Jong Yeul Jeong, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 555 days.

(21) Appl. No.: 17/669,564

(22) Filed: Feb. 11, 2022

(65) Prior Publication Data

US 2023/0070272 A1   Mar. 9, 2023

(30) Foreign Application Priority Data

Sep. 8, 2021  (KR) .................. 10-2021-0119690

(51) Int. Cl.
| | | |
|---|---|---|
| H10D 1/00 | (2025.01) | |
| H01L 21/768 | (2006.01) | |
| H01L 23/522 | (2006.01) | |
| H10D 1/68 | (2025.01) | |

(52) U.S. Cl.
CPC ........ *H10D 1/043* (2025.01); *H01L 21/76838* (2013.01); *H01L 23/5226* (2013.01); *H10D 1/716* (2025.01)

(58) Field of Classification Search
CPC ............... H01L 28/92; H01L 21/76838; H01L 21/76883; H01L 21/76877; H01L 21/7684; H01L 21/76885; H01L 21/76886; H01L 21/76892; H01L 23/5226; H01L 23/5283; H01L 23/53295; H01L 23/528; H10D 1/043; H10D 1/716
See application file for complete search history.

(56) References Cited

U.S. PATENT DOCUMENTS

| | | |
|---|---|---|
| 7,439,141 B2 | 10/2008 | Kim et al. |
| 9,299,697 B2 | 3/2016 | West et al. |
| 9,583,558 B2 | 2/2017 | West et al. |

(Continued)

FOREIGN PATENT DOCUMENTS

| | | |
|---|---|---|
| JP | 64-50442 A | 2/1989 |
| JP | 8-8261 A | 1/1996 |

(Continued)

OTHER PUBLICATIONS

Korean Office Action issued on Apr. 27, 2023, in counterpart Korean Patent Application No. 10-2021-0119690 (5 pages in Korean).

*Primary Examiner* — Jessica S Manno
*Assistant Examiner* — Andrew Chung
(74) *Attorney, Agent, or Firm* — NSIP Law (57) ABSTRACT

A semiconductor device is provided. The semiconductor device includes a logic region and a capacitor region, wherein the capacitor region comprises a bottom electrode disposed on a substrate; a top electrode disposed on the bottom electrode; a first inter-metal dielectric film disposed between the substrate and the bottom electrode; a second inter-metal dielectric film and a third inter-metal dielectric film disposed between the top electrode and the bottom electrode; a passivation film disposed on the top electrode, wherein the top electrode is configured to have a rounded top corner, and the bottom electrode is configured to have a sharp top corner.

15 Claims, 10 Drawing Sheets

(56) References Cited

U.S. PATENT DOCUMENTS

| | | |
|---|---|---|
| 9,768,245 B2 | 9/2017 | West et al. |
| 9,806,148 B2 | 10/2017 | Selvaraj et al. |
| 10,147,784 B2 | 12/2018 | West et al. |
| 10,186,576 B2 | 1/2019 | Selvaraj et al. |
| 11,107,883 B2 | 8/2021 | Selvaraj et al. |
| 2009/0218233 A1* | 9/2009 | Fredenberg ............ C25D 7/126 205/640 |
| 2010/0327458 A1* | 12/2010 | Ichiki .................... H01L 23/528 257/E23.151 |
| 2016/0020168 A1* | 1/2016 | Kao ...................... H01L 23/528 438/622 |
| 2018/0374895 A1* | 12/2018 | Hsu ........................ H10N 50/01 |
| 2021/0367030 A1 | 11/2021 | Selvaraj et al. |
| 2021/0376228 A1* | 12/2021 | Peng ...................... H10N 50/80 |

FOREIGN PATENT DOCUMENTS

| | | |
|---|---|---|
| JP | 2018-517283 A | 6/2018 |
| WO | WO 2016/164587 A1 | 10/2016 |

\* cited by examiner

SEMICONDUCTOR DEVICE WITH DIGITAL ISOLATOR CAPACITOR AND MANUFACTURING METHOD THEREOF

CROSS-REFERENCE TO RELATED APPLICATION

This application claims the benefit under 35 U.S.C. § 119 of Korean Patent Application No. 10-2021-0119690 filed on Sep. 8, 2021, in the Korean Intellectual Property Office, the entire disclosure of which is incorporated herein by reference for all purposes.

BACKGROUND

1. Field

The following description relates to a semiconductor device with a digital isolator capacitor and a manufacturing method thereof.

2. Description of Related Art

A voltage implemented in a digital isolator may be increased. By increasing the voltage, it may be easier for a leakage current to occur because of a large potential difference between a top electrode and an adjacent top metal. A path into which a leakage current flows may appear in a closest straight path, or it may appear in a path where a dielectric strength may be relatively low even though a distance is far.

Materials such as a passivation film (passivation dielectric) and a molding compound may be disposed near a top metal or a top corner of a top electrode. In examples, a dielectric strength of a molding compound may be lower than a dielectric strength of a passivation film. Therefore, it may be easy for a dielectric breakdown to occur in a molding compound even though a potential difference may be small. When a dielectric breakdown occurs, it may not be implemented as a digital isolator, or features may be degraded.

When a wide gap exists between a top metal and a top electrode, a potential difference per distance may become low, thus resulting in improvement of a leakage current. However, there may be an increase in size by as much as the gap between a top metal and a top electrode, which is not economical.

A top corner of a top electrode of a conductor formed by a typical semiconductor process may generally have a sharp angle. In examples, a passivation film may be formed for insulation and protection of a top metal or a top electrode. There may be a molding compound around the passivation film. When a high voltage is applied to a conductor structure having a sharp edge, an electric field may be concentrated to a layer around a sharp edge, and accordingly, a dielectric breakdown may occur.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, a semiconductor device includes a logic region and a capacitor region, wherein the capacitor region includes a bottom electrode disposed on a substrate; a top electrode disposed above the bottom electrode; a first inter-metal dielectric film disposed between the substrate and the bottom electrode; a second inter-metal dielectric film and a third inter-metal dielectric film disposed between the top electrode and the bottom electrode; and a passivation film disposed on the top electrode, wherein the top electrode is configured to have a rounded top corner, and the bottom electrode is configured to have a sharp top corner.

The third inter-metal dielectric film may be recessed with respect to a bottom plane of the top electrode.

Each of the second inter-metal dielectric film and the third inter-metal dielectric film may be configured to have a thickness greater than a thickness of the first inter-metal dielectric film.

The logic region may include a pre-metal dielectric film disposed on the substrate; a first metal line disposed on the pre-metal dielectric film; a second metal line disposed above the first metal line, wherein the second metal line may be disposed on a same plane as the bottom electrode; a third metal line disposed above the second metal line; and a top metal line disposed above the third metal line, wherein the top metal line may be disposed on a same plane as the top electrode, and may be configured to have a rounded top corner.

Each of the top metal line and the top electrode may be configured to have a fully rounded sidewall.

Each of the top metal line and the top electrode may be configured to have a vertical sidewall.

In a general aspect, a semiconductor device manufacturing method includes forming a first inter-metal dielectric film on a substrate; forming a bottom electrode on the first inter-metal dielectric film; forming a second inter-metal dielectric film on the bottom electrode; forming a top metal layer on the second inter-metal dielectric film; patterning the top metal layer to form a top electrode; and forming a passivation film on the top electrode, wherein the top electrode is configured to have a rounded top corner, and the bottom electrode is configured to have a sharp top corner.

The patterning of the top metal layer to form the top electrode may include performing an etching process on the top metal layer with a mask pattern to form the top electrode; and removing the mask pattern to expose the top electrode; and performing an isotropic etching process to form the rounded top corner of the top electrode.

The isotropic etching process may include a sputter etching process, and wherein the sputter etching process may implement one of Ar and Ge plasma source gas.

The patterning of the top metal layer to form the top electrode may further include performing an anisotropic etching process to form a vertical sidewall of the top electrode.

The isotropic etching process may implement a plasma source gas different from the anisotropic etching process.

The method may include performing a chemical mechanical polishing (CMP) process to flatten the passivation film; and performing an etch-back process on the top metal layer to form the top electrode having the rounded top corner.

The patterning of the top metal layer to form the top electrode may include forming a mask pattern on the top metal layer; performing an etching process on the top metal layer with the formed mask pattern to form the top electrode; removing the mask pattern to expose the top electrode; and performing a sputter etching process on the exposed top electrode with an inert gas to smooth the top corner of the top electrode.

In a general aspect, a semiconductor device includes a logic region and a capacitor region, wherein the logic region includes a plurality of metal lines, and the capacitor region includes a bottom electrode disposed on a same plane as one of the plurality of metal lines of the logic region; a top electrode disposed on a same plane as a top metal line of the plurality of metal lines of the logic region; the top metal line and the top electrode are each configured to have one of a rounded top corner and rounded side walls, and a top corner of the bottom electrode is configured to be formed at a right angle.

The semiconductor device may further include a pre-metal dielectric film disposed on a substrate; a first inter-metal dielectric film disposed on the pre-metal dielectric film; a second inter-metal dielectric film disposed on the first inter-metal dielectric film; a third inter-metal dielectric film disposed on the second inter-metal dielectric film, and a passivation film configured to cover the top electrode.

The bottom electrode may be disposed on the first inter-metal dielectric film, and the top electrode may be disposed on the third inter-metal dielectric film.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The one or more examples may provide a method of forming a top metal or a top electrode in a digital isolator with a low possibility of a dielectric breakdown by dispersing an electric field, through forming a rounding or sloping in a top corner of a top metal or a top electrode.

A targeted problem is not limited by the problems mentioned above. A person skilled in the relevant field of technology may understand other problems from the following description.

A detailed description is given below, with attached drawings.

Figure 1:
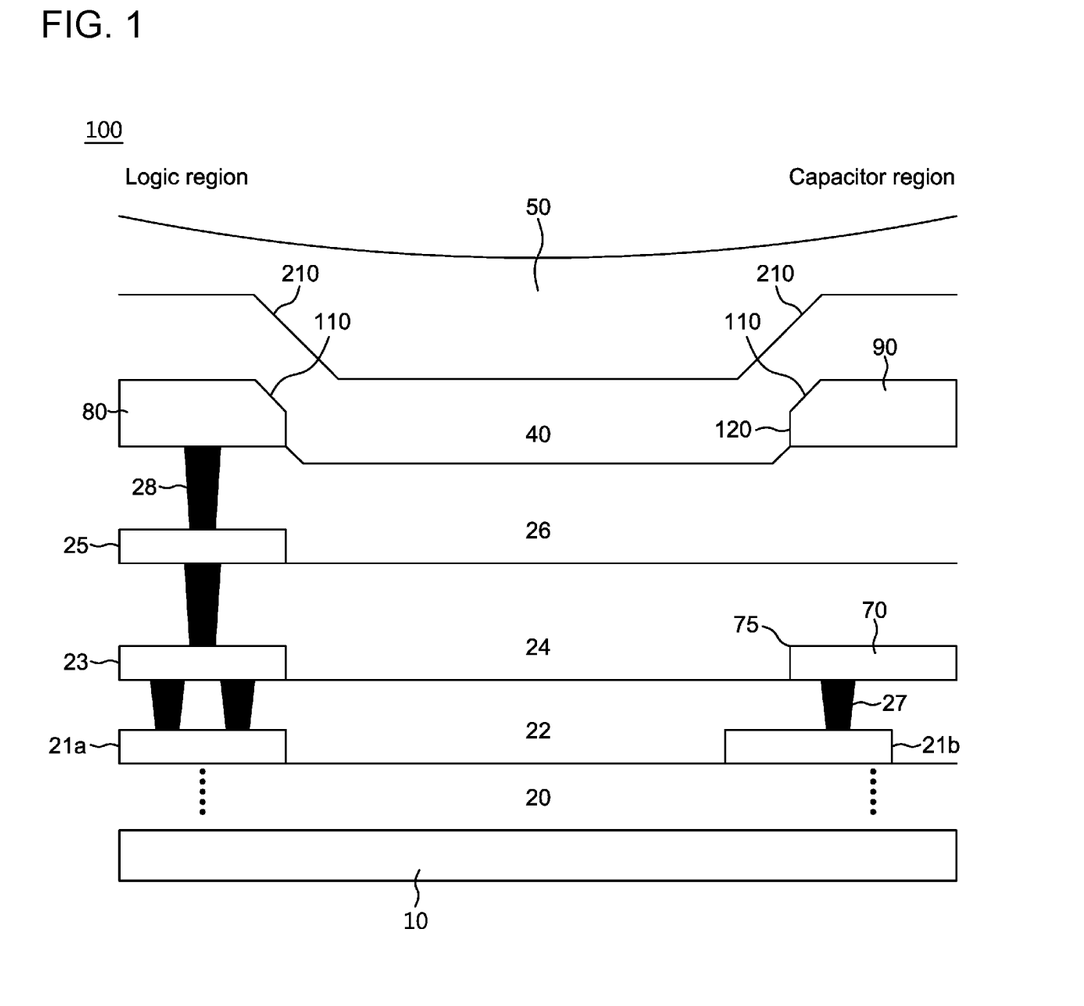
FIG. 1 illustrates a cross-sectional view of an example semiconductor device including a digital isolator capacitor, in accordance with one or more embodiments.

FIG. 1 illustrates a cross-sectional view of an example semiconductor device including a digital isolator capacitor in accordance with one or more embodiments.

A semiconductor device 100 including a digital isolator capacitor in accordance with one or more embodiments may be divided into a logic region and a capacitor region. The logic region may process a digital or analog signal for an input/output of data. The capacitor region may recharge or discharge an electron.

The logic region may include a plurality of metal lines including a first metal line 21a, a second metal line 23, a third metal line 25, and a top metal line 80. Via 28 may be formed between metal lines. For example, the Via 28 may be formed between the top metal line 80 and the third metal line 25. The Via 28 may be desired to electrically connect metal lines formed therebetween in the logic region. The first metal line 21a, the second metal line 23, the third metal line 25, and the top metal line 80 may be formed by implementing as non-limiting examples, one of Al, Al—Cu, Cu, W, Ta, Ti, WN, TaN, TiN. In an example, the VIA may implement one of W, Cu, and Al material. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

In an example, the capacitor region may include another first metal line 21b, Via 27, a bottom electrode 70, and a top electrode 90. The Via 27, formed in the capacitor region, may electrically connect the first metal line 21b and the bottom electrode 70. In a non-limiting example, the first metal line 21b, the bottom electrode 70, and the top electrode 90 may be formed by implementing one of Al, Al—Cu, Cu, W, Ta, Ti, WN, TaN, TiN. The Via 27 may implement one of a W, Cu, and Al material.

Referring to FIG. 1, a semiconductor device including a digital isolator capacitor in accordance with one or more embodiments may include a pre-metal dielectric film 20 disposed on a substrate 10; a first inter-metal dielectric film (IMD) 22 disposed on the pre-metal dielectric film 20; a bottom electrode 70 disposed on a first inter-metal dielectric film 22; a second inter-metal dielectric film 24, and a third inter-metal dielectric film 26 disposed on the bottom electrode 70; a top electrode 90 disposed on the second inter-metal dielectric film 24 and the third inter-metal dielectric film 26; and a passivation film 40 configured to cover the top electrode 90. A top corner 110 of the top electrode 90 may have more rounding or sloping, rather than a top corner 75 of the bottom electrode 70.

It should be noted that the top corners 110 on opposite sides of the top electrode 90 may all have a sloping or rounded shape. Likewise, top corners 110 of the top metal line 80 may have a sloping or rounded shape. Since the top metal line 80 or the top electrode 90 may have an elongated form factor, for simplification purposes, it is illustrated with only one rounded side. It is illustrated in a similar manner in other drawings.

The top metal line 80 and the top electrode 90 may have rounded top corners, rather than a sharp angled top corner. Although high electric field may be applied to the digital isolator capacitor, the electric field may be dispersed due to the rounded top corner. Accordingly, a breakdown voltage may be increased in the digital isolator.

Each of the bottom electrode 70 and the top electrode 90 may have a different shape at the top corner of the digital isolator capacitor. The bottom electrode 70 may have a sharp angle, or a right angle, at the top corner 75, where the sharp angle may be approximately 90 degrees. On the other hand, the top electrode 90 may have a tilted angle at the top corner 110. The tilted angle may be almost 45 degrees. Accordingly, the top electrode 90 may have a top corner that is more sloping or slanted than the bottom electrode 70. Either the top metal line 80 or the top electrode 90 may have a vertical profile at a sidewall surface 120. The vertical profile may be almost 85-90 degrees.

A plurality of inter-metal dielectric films may comprise the pre-metal dielectric film 20 crossing, or disposed between, the logic region and the capacitor region, a first inter-metal dielectric film 22, a second inter-metal dielectric film 24, and a third inter-metal dielectric film 26. The second inter-metal dielectric film 24 and the third inter-metal dielectric film 26 may be sequentially deposited, and may be disposed adjacent to each other.

Each of the respective second and third inter-metal dielectric films 24 and 26 may have a thickness that is greater than a thickness of the first inter-metal dielectric film 22. The first inter-metal dielectric film 22 may have a thickness that ranges from 0.2 µm to 2.0 µm, and more desirably, from 0.4 µm to 1.5 µm. Each of the second inter-metal dielectric film 24 and the third inter-metal dielectric film 26 may have a thickness that ranges from 1.0 µm to 10.0 µm, and more desirably, from 3 µm to 8 µm.

In an example, the first inter-insulating layer 20, the first inter-metal dielectric film 22, the second inter-metal dielectric film 24, and the third inter-metal dielectric film 26 may implement one of $SiO_2$, SiOF, undoped silicate glass (USG), fluorine doped silicate glass (FSG), high-density plasma oxide (HDP), SiOC, SiOCH, and low-k material. However, the examples are not limited thereto.

The passivation film 40 may be formed or disposed on the pre-metal dielectric film 20 and the plurality of inter-metal dielectric films 22, 24 and 26, and may be further disposed on the top metal line 80, and the top electrode 90. The passivation film 40 may include, as non-limiting examples, $SiO_2$ and/or SiN, but it is not limited thereto. It may be desirable that a thickness of the passivation film 40 is 0.2 µm to 2.0 µm, and more desirably to 0.4 µm to 1.5 µm. The passivation film may prevent impurities that are inputted or received from an exterior source from entering the logic region or the capacitor region. Accordingly, the passivation film 40 may be called a blocking insulating layer.

Additionally, in an example, a semiconductor device including a digital isolator capacitor may further include an air space or a molding compound layer 50 that may be formed on the passivation film 40. In one or more examples, a dielectric strength of the air space or the molding compound layer 50 may be lower than a dielectric strength of the passivation film 40.

In an example semiconductor device including a digital isolator capacitor of the one or more examples, by forming the top corner 110 of the top electrode 90 to be rounding or sloping, a breakdown voltage may be high even though a high voltage is applied to the top electrode 90.

Additionally, an example semiconductor device including a digital isolator capacitor may have a wire bonding with an adjacent semiconductor device including a digital isolator capacitor.

Figure 2:
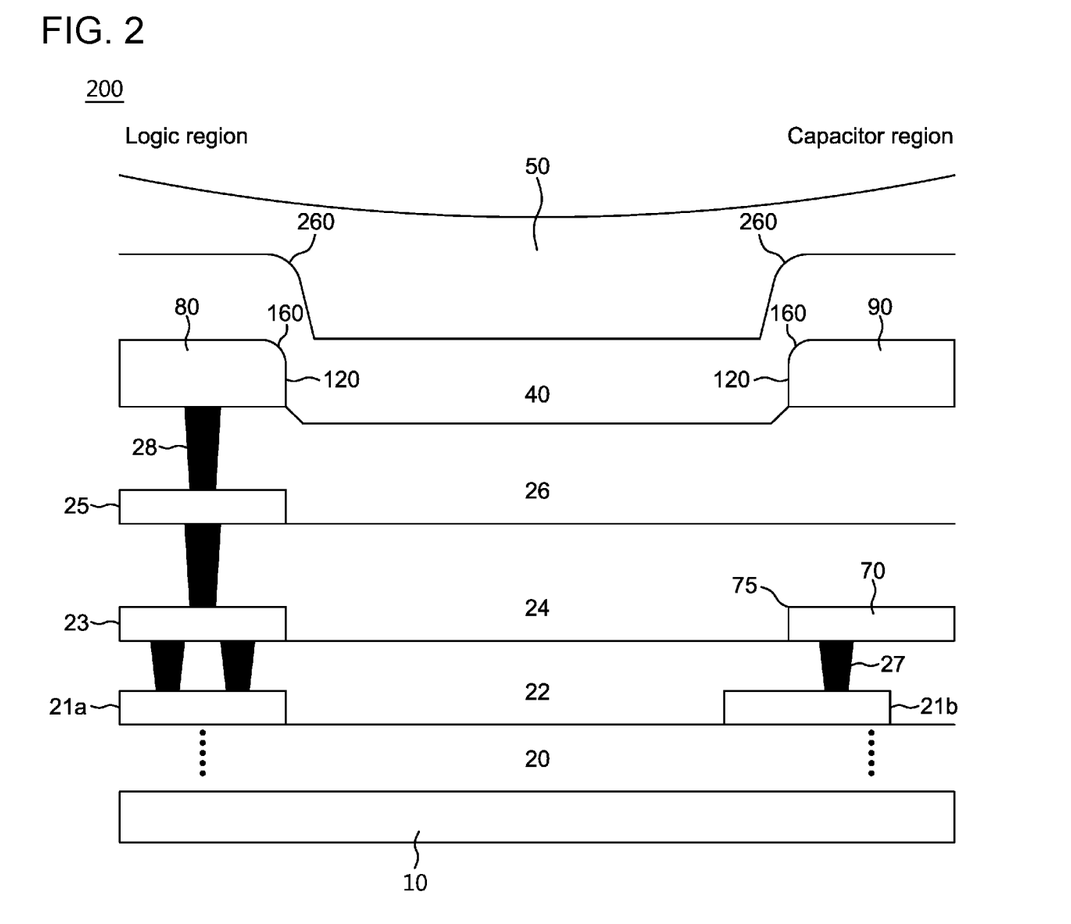
FIG. 2 illustrates a cross-sectional view of an example semiconductor device including a digital isolator capacitor, in accordance with another one or more embodiments.

FIG. 2 illustrates a cross-sectional view of an example semiconductor device including a digital isolator capacitor in accordance with another one or more embodiments.

Referring to FIG. 2, an example semiconductor device 200 including a digital isolator capacitor, in accordance with one or more embodiments, may include a substrate 10; a pre-metal dielectric film 20; a first inter-metal dielectric film 22, a second inter-metal dielectric film 24; a third inter-metal dielectric film 26; a top metal line 80 and a top electrode 90; and a passivation film 40. Herein, by an over etching of the top metal line 80 and the top electrode 90, the third inter-metal dielectric film 26 may be implemented with a thin form factor. The third inter-metal dielectric film 26 may be recessed with respect to a bottom plane of the top electrode 90.

A portion of a top corner 160 of the top metal line 80 and the top electrode 90 may have a circular, round, or oval shape. Although a high voltage may be applied to the top metal line 80 and the top electrode 90, an electrical field may be dispersed due to a circular, round, or oval shape top corner. Accordingly, a breakdown voltage may be more increased with the rounded top corner.

In an example, the top corner of the bottom electrode 70 and the top electrode 90 may have different shapes. The bottom electrode 70 may have a sharp angle, or right angle, at the top corner 75. On the other hand, the top electrode 90 may have a rounded top corner 160.

A sputter etching process may be performed to form the rounded top corner 160 in the top metal line 80 and the top electrode 90. In a non-limiting example, the sputter etching process may use Ar or Ge inert gas. The round top corner 160 may be formed in the top electrode 90 due to the sputter etching using inert gases, such as Ar or Ge, etc. When a sputter etching is performed by implementing Ar or Ge plasma source gas, etc., the top electrode 90 may have a rounded top corner rather than a slanted top corner.

Figure 3:
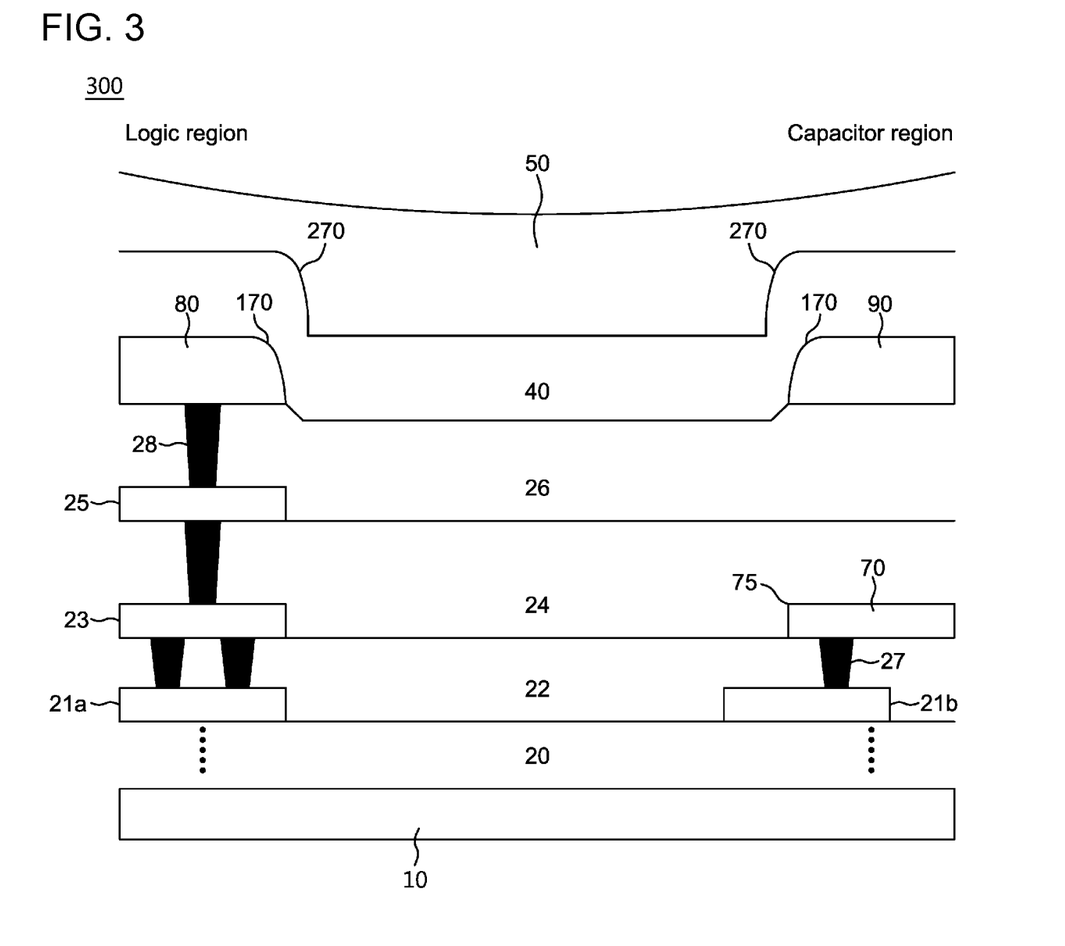
FIG. 3 illustrates a cross-sectional view of an example semiconductor device including a digital isolator capacitor, in accordance with another one or more embodiments.

FIG. 3 illustrates a cross-sectional view of an example semiconductor device including a digital isolator capacitor in accordance with another one or more embodiments.

As discussed above, FIG. 2 illustrates that the top electrode 90 may have a rounded top corner. However, FIG. 3 illustrates that the top electrode 90 may have a rounded sidewall 770 as well as rounded top corner. Additionally, a sidewall and a top corner of the top metal line 80 and the top electrode 90 may be all rounded. A sputter etching implementing Ar or Ge plasma source gas may induce the fully rounded shape at the sidewall and top corner of the top metal line 80 and the top electrode 90.

In an example semiconductor device including a digital isolator capacitor, it may be desirable that top corners 110 of the top metal line 80 and the top electrode 90 are tilted, round, or oval, but they are not limited thereto.

FIGS. 4A-4D illustrate a manufacturing method of an example semiconductor device including a digital isolator capacitor in accordance with one or more embodiments.

Figure 4A:
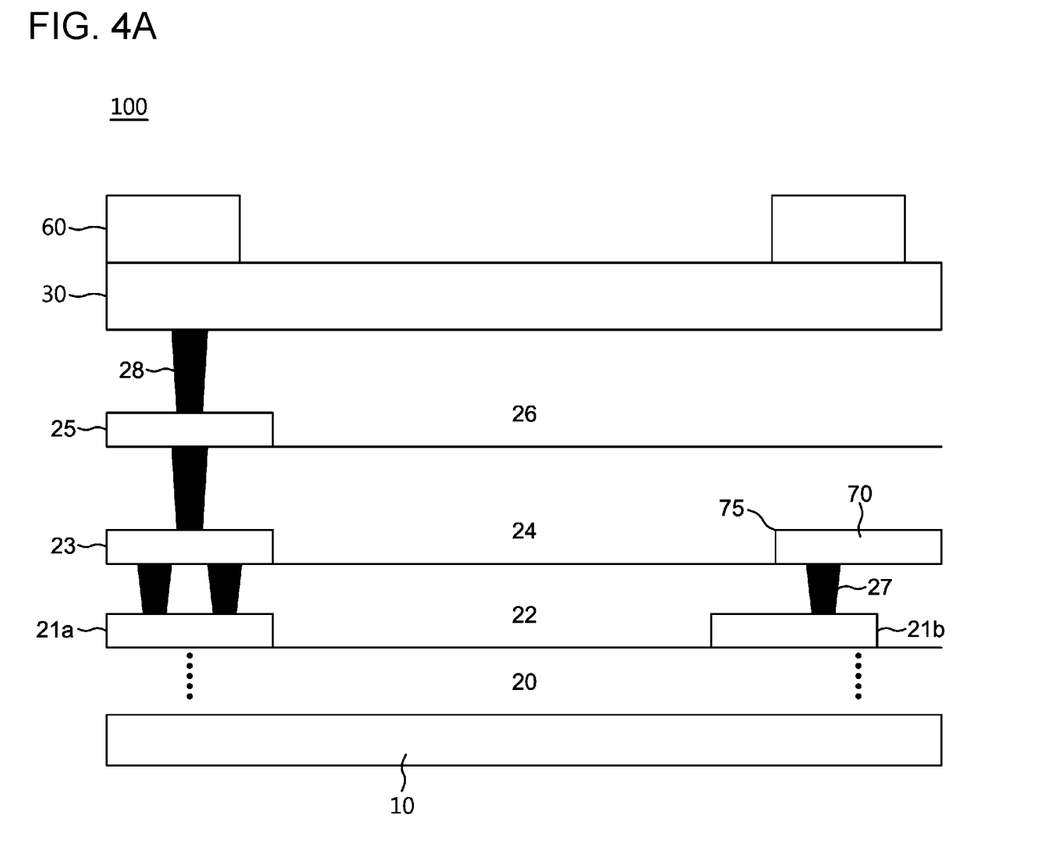
FIGS. 4A-4D illustrate a manufacturing method of an example semiconductor device including a digital isolator capacitor, in accordance with one or more embodiments.

Referring to FIG. 4A, the pre-metal dielectric film 20, for example, an oxide layer, may be formed on a substrate 10. First metal lines 21a and 21b may be formed on the pre-metal dielectric film 20. A first inter-metal dielectric film 22 may be formed on the first metal lines 21a and 21b. Vias 27 and 28 may be formed in the first inter-metal dielectric film 22. A bottom electrode 70 and a second metal line 23, for example, Al, Cu, Al—Cu, etc., may be formed to connect the Vias. A second inter-metal dielectric film 24, for example, an oxide layer may be formed on the bottom electrode 70 and the second metal line 23. A third metal line 25 may be formed on the second inter-metal dielectric film (IMD) 24 in the logic region. On the other hand, a capacitor region may not have a third metal line 25. A third inter-metal dielectric film 26, for example, an oxide layer, may be formed on the third metal line 25. The second and third inter-metal dielectric films 24 and 26 may be formed in a contacting manner with each other. The first inter-metal dielectric film 22 may have a thickness that ranges from 0.4-1.5 µm. Each of the second and third inter-metal dielectric films 24 and 26 may have a thickness that ranges from 3 µm to 8 µm. The top metal layer 30, such as Al, Cu, Al—Cu, as only examples, may be formed on the second and third inter-metal dielectric films 24 and 26. A photo resist layer (PR) mask pattern 60 (or a hard mask pattern) may be formed on opposite sides of the top metal layer 30. The hard mask pattern may be formed using, as only examples, SiO2, SiN, SiON, etc.

Figure 4B:
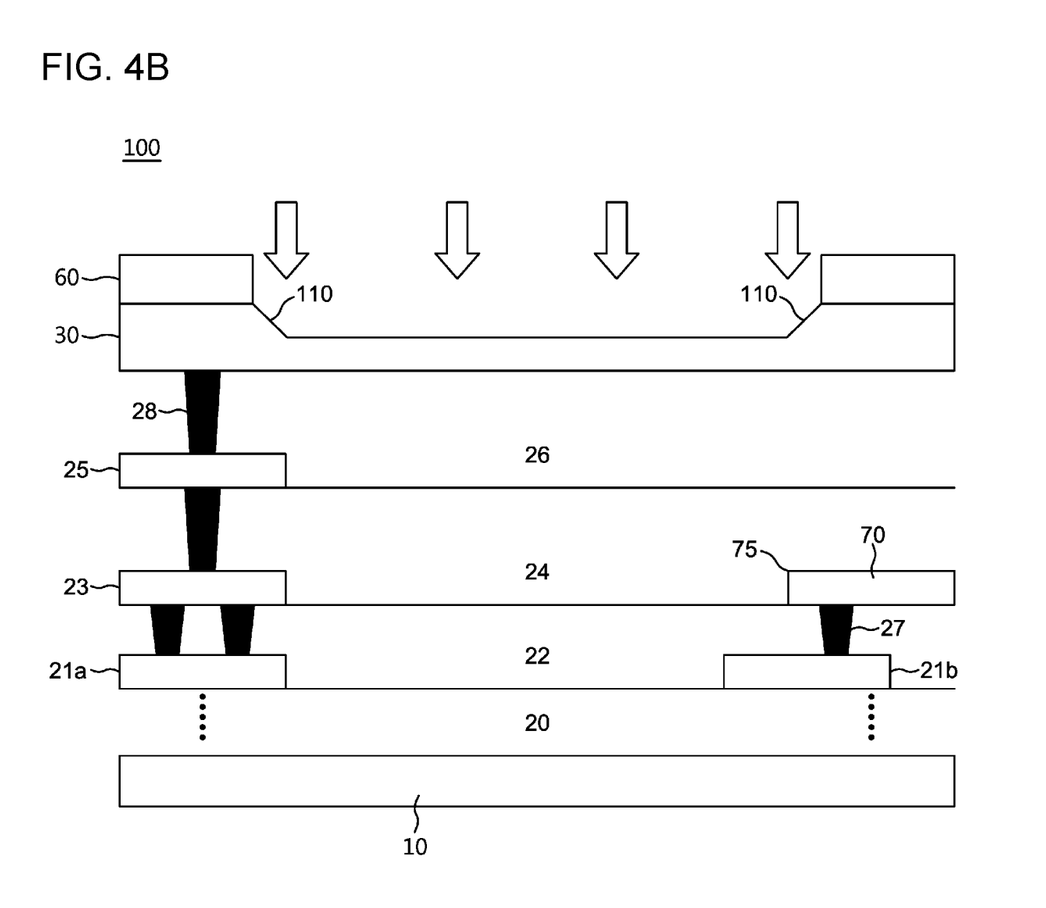

Referring to FIG. 4B, a first etching process may be performed to etch the top metal layer by implementing the mask pattern 60. The top metal layer 30 may have a tilted sidewall 110 based on the first etching process. The tilted sidewall 110 may be formed by, as only an example, a polymer passivation method in the first etching process. The polymer passivation method may be performed with an isotropic etching.

Figure 4C:
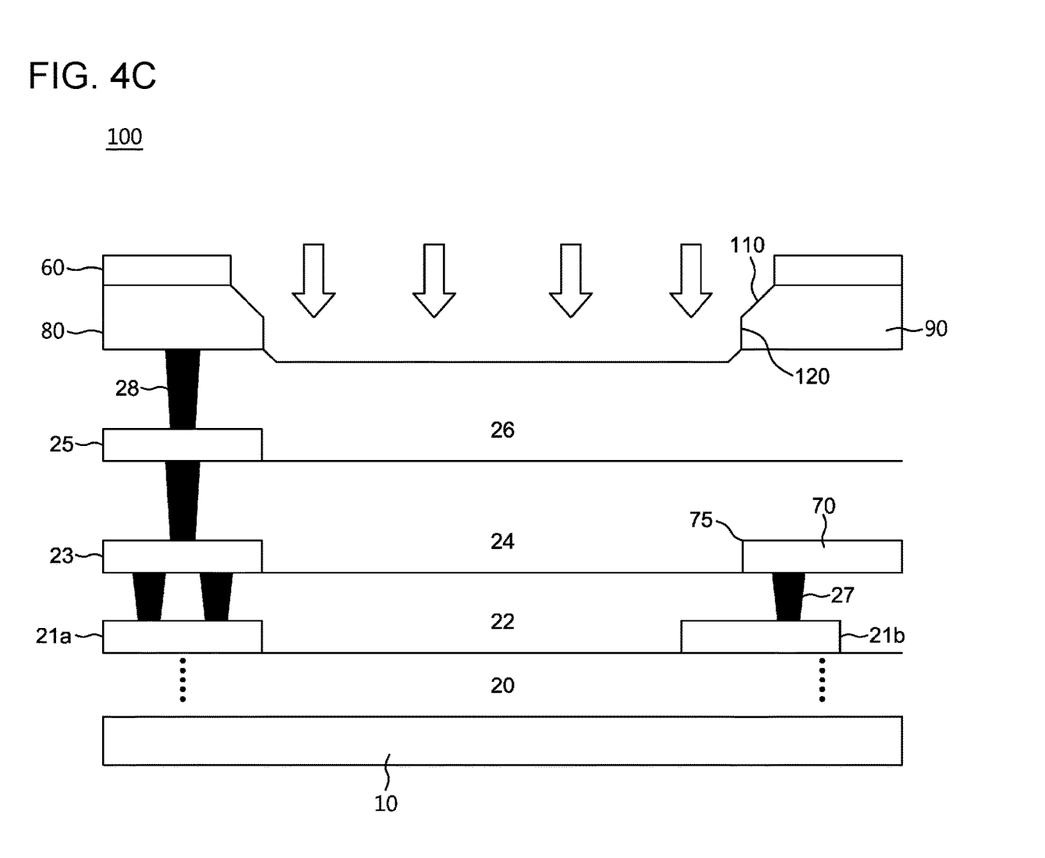

Referring to FIG. 4C, a second etching process may be performed to completely etch the remaining top metal layer 30, such that a vertical profile is obtained at the sidewall 120 of the top metal 90. The first and second etching process may implement the first and second etching gases, respectively. The first etching gas may include different plasma source gases from the second etching gas. Each of the first and second etching gases may include one or more gases selected from a group comprising a fluoric or chloric gas; an inert gas; and a hydro carbonaceous gas, as examples. The fluoric or chloric gas may be one or more gases selected from a group comprising $NF_3$, $C_2F_6$, $CF_4$, $CHF_3$, $C_2HF_5$, $SF_6$, $Cl_3$ and $BCl_3$, but it is not limited thereto. Additionally, the inert gas may be one or more gases selected from a group comprising He, N2, and Ar, but it is not limited thereto. Additionally, the hydro carbonaceous gas may be one or more gases selected from a group comprising $CH_4$, $C_2H_4$, and $C_2H_2$, but it is not limited thereto. The second thick IMD 24 may become thin after the second etching process. The top electrode 90 may have tilted top corner 110 and vertical sidewall 120 based on the first and second etching processes. The top metal line 80 may also have a similar profile as the top electrode 90. After the second etching process, the PR mask pattern 60 (or the hard mask pattern) may be removed, and a cleaning process may be performed to remove a polymer residue.

Figure 4D:
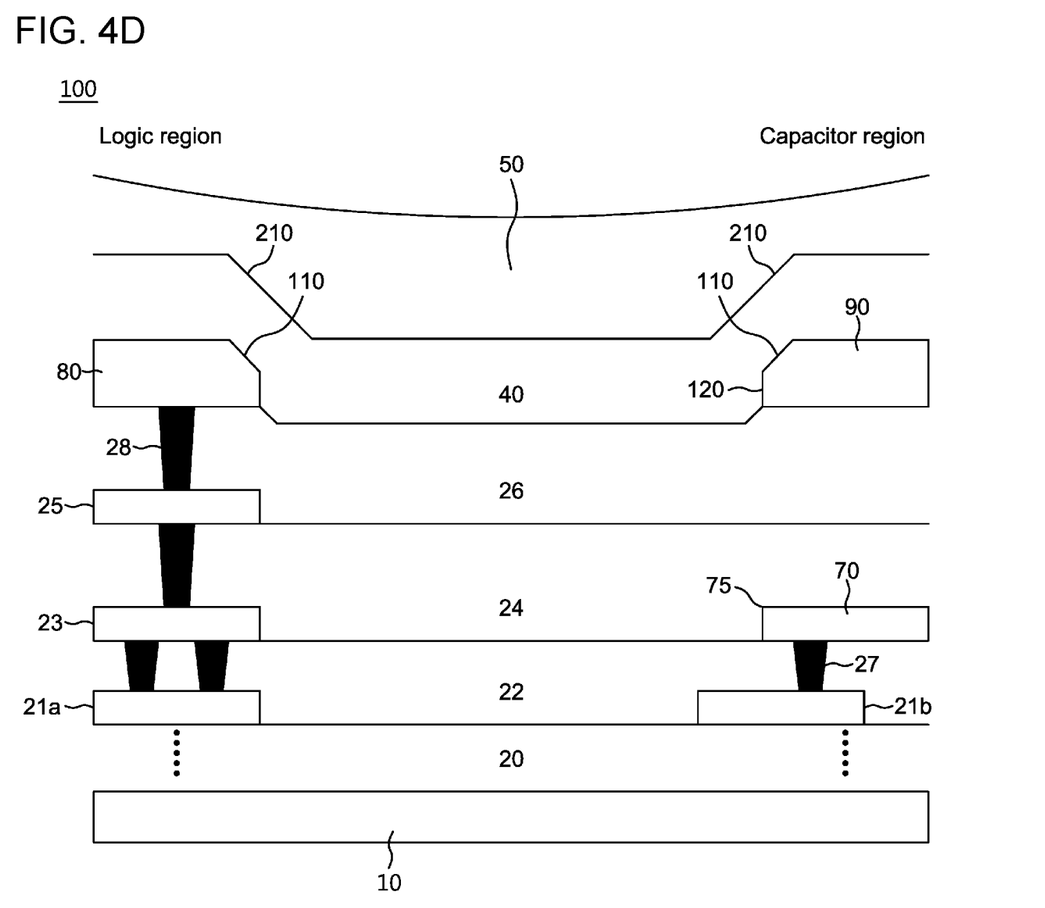

Referring to FIG. 4D, the passivation film 40 may be formed to cover the third inter-metal dielectric film 26, the top metal line 80, and the top electrode 90. By patterning the passivation film 40, the top metal line 80 and the top electrode 90 may be exposed (not shown), and a molding compound 50 may be formed on the passivation film 40.

FIGS. 5A-5D illustrate a process of a manufacturing method of an example semiconductor device including a digital isolator capacitor in accordance with another one or more embodiments.

Figure 5A:
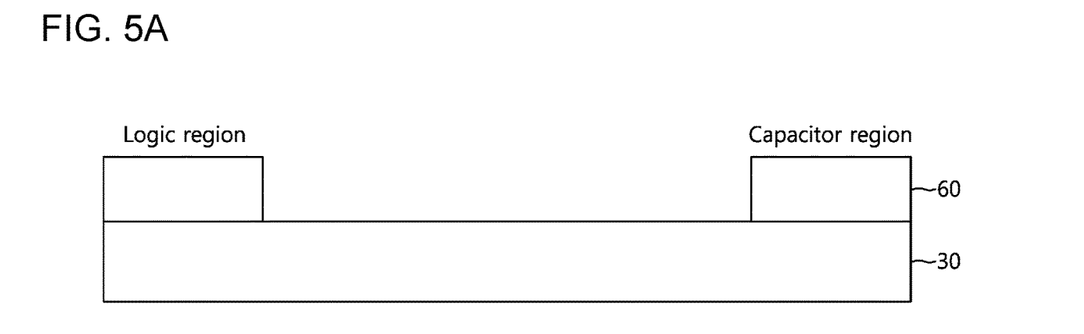
FIGS. 5A-5D illustrate a manufacturing method of an example semiconductor device including a digital isolator capacitor, in accordance with another one or more embodiments.

Referring to FIG. 5A, PR mask patterns 60 (or a hard mask pattern) may be formed on the top metal layer 30.

Figure 5B:
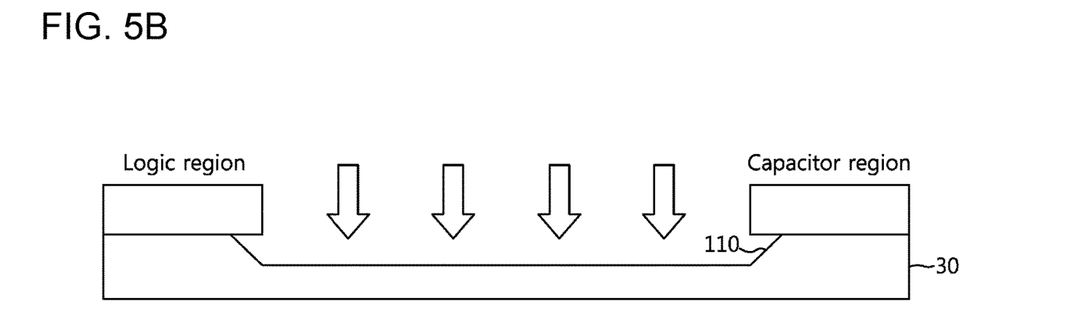

Referring to FIG. 5B, an isotropic etching process may be performed to etch the top metal layer 30 by implementing the PR mask pattern 60 (or the hard mask pattern), such that the top metal layer 30 may have a tilted profile 110 at the top corner. An isotropic etching process may be implemented with a wet etching process by implementing a chemical solution. A dry etching may be also implemented for the isotropic etching process, instead of a wet etching process. In the dry etching, a low bias power, for example, ranging from 10 W to 90 W, more desirably from 40 W to 60 W may be employed.

Figure 5C:
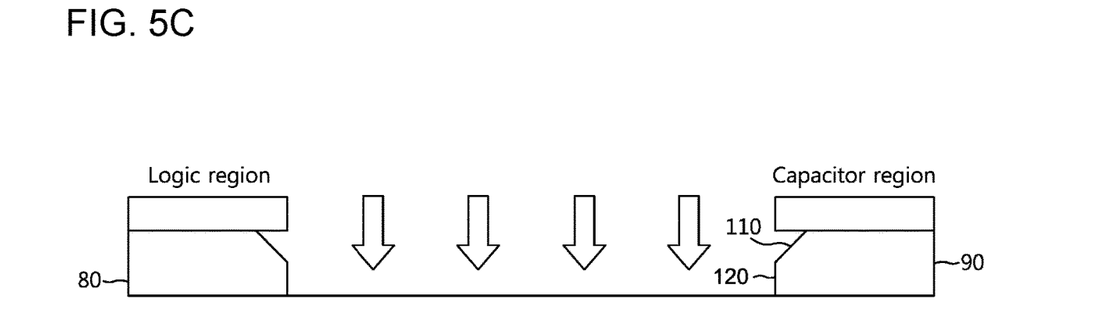

Referring to FIG. 5C, an anisotropic etching process may be performed to etch the top metal layer 30 by implementing the PR mask pattern 60 (or the hard mask pattern) with a second bias power, such that the top metal layer 30 may have a vertical profile at the sidewall 120. The second bias power used in the anisotropic etching process may be higher than a first bias power used in the isotropic etching process to reinforce an etching of a vertical direction. In an example, it may be desirable for the second bias power to be 100 W to 500 W, and more desirably to be 150 W to 250 W.

Figure 5D:
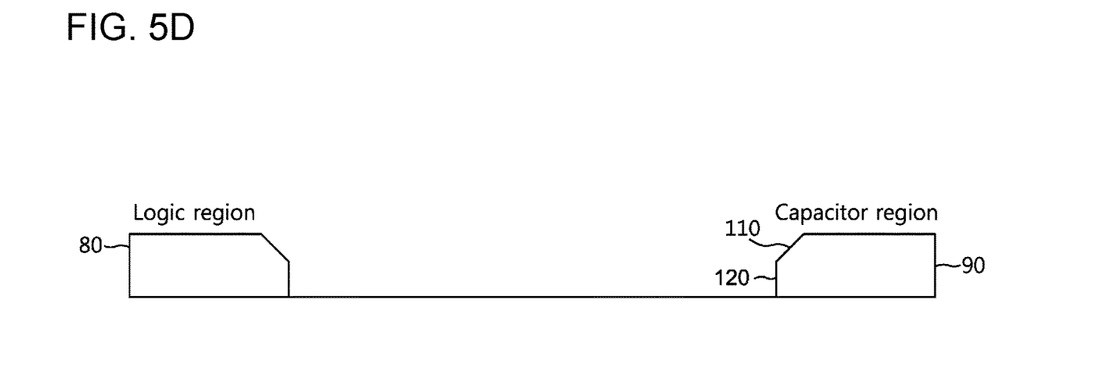

Referring to FIG. 5D, a cleaning process may be performed to remove the PR mask pattern 60 (or the hard mask pattern).

FIGS. 6A-6D illustrate a manufacturing method of an example semiconductor device including a digital isolator capacitor in accordance with another one or more embodiments.

Figure 6A:
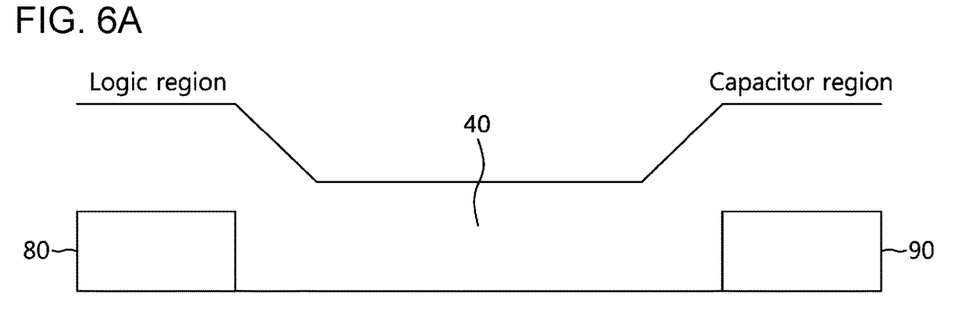
FIGS. 6A-6D illustrate a manufacturing method of an example semiconductor device including a digital isolator capacitor, in accordance with another one or more embodiments.

Referring to FIG. 6A, the top metal line 80 may be formed, or disposed, to be spaced apart from the top electrode 90. Each of the top metal line 80 and the top electrode 90 may have a sharp angle at the top corner. Then, a first passivation film 40 may be formed on the top metal line 80 and the top electrode 90.

Figure 6B:
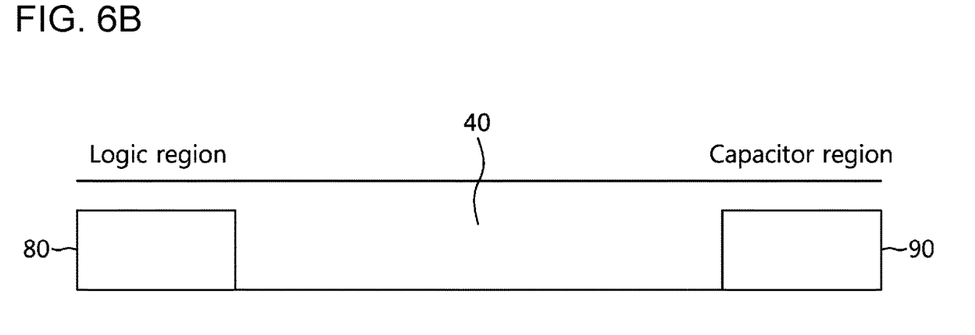

Referring to FIG. 6B, a chemical mechanical polishing (CMP) process may be performed to flatten the first passivation film 40.

Figure 6C:
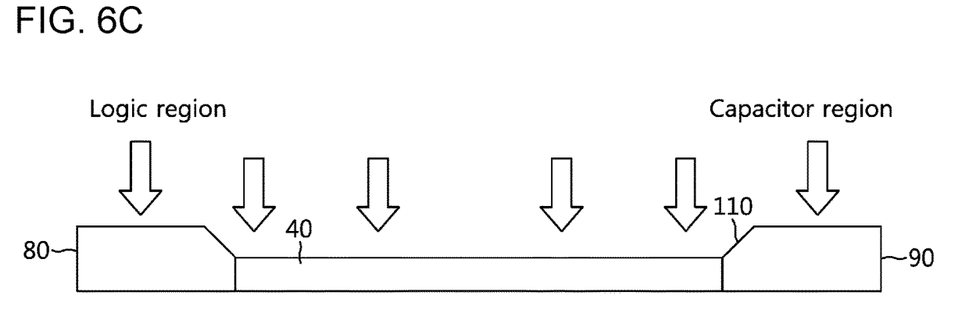

Referring to FIG. 6C, a first etch-back process may be performed to etch the first passivation film 40, the top metal line 80 and the top electrode 90. Once the top electrode 90 is exposed, a second etch-back process may be performed. The second etch back process may make the top corner 110 tilted. The passivation film 40 may remain between the top metal line 80 and top electrode 90 even after the second etch back process is performed. The first passivation film 40 and the top electrode 90 may become thin based on the second etch-back process. Therefore, since the top electrode 90 may become thin based on the second etch-back process, an initial thickness of the top metal layer 30 may be configured to be thick. On the basis of the first and second etch-back processes, the top corner 110 of the top electrode 90 may be formed to have a round or sloped shape.

Figure 6D:
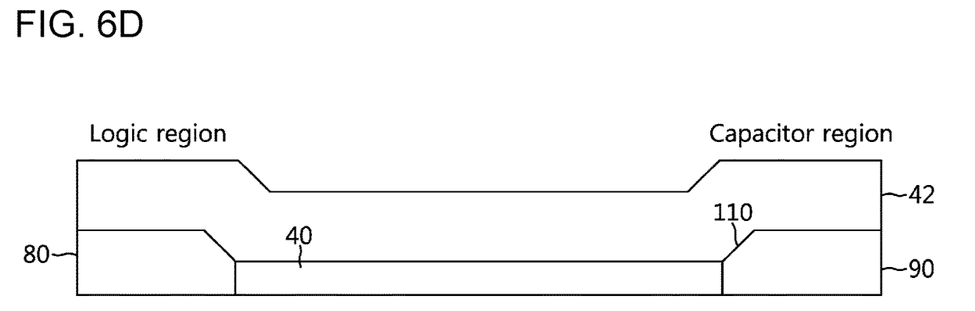

Referring to FIG. 6D, a second passivation film 42 may be formed on the first passivation film 40. In an example, the first passivation film 40 and the second passivation film 42 may be formed with the same material, or they may be formed with different materials. In an example, the first passivation film 40 may be formed by SiO2, while the second passivation film 42 is formed by SiN.

FIGS. 7A-7D illustrates a manufacturing method of an example semiconductor device including a digital isolator capacitor in accordance with another one or more embodiments.

Figure 7A:
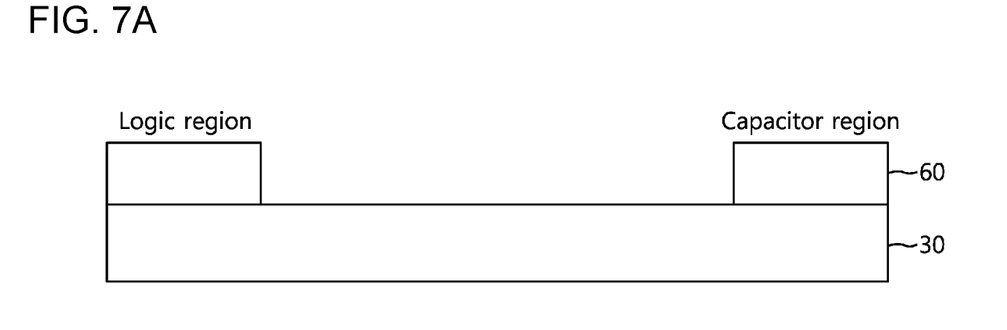
FIGS. 7A-7D illustrate a manufacturing method of an example semiconductor device including a digital isolator capacitor, in accordance with another one or more embodiments.

Referring to FIG. 7A, PR mask patterns (or hard mask pattern) 60 may be formed on the top metal layer 30.

Figure 7B:
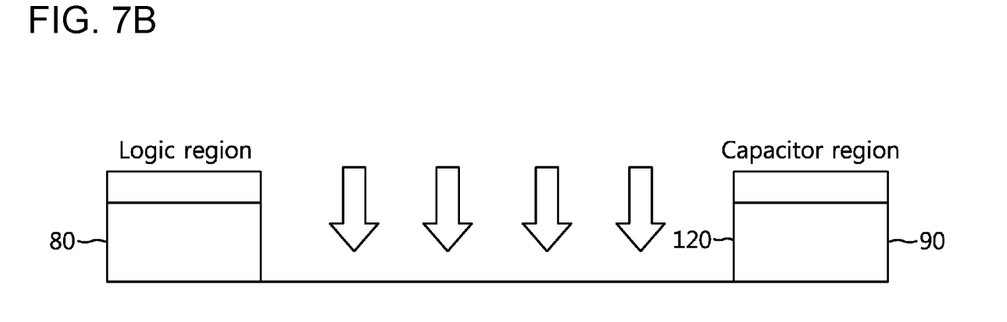

Referring to FIG. 7B, a first etching process may be performed to etch the top metal layer 30 for to form the top electrode 90. The first etching processing may be performed with a reactive ion etching (RIE). A plasma source gas containing fluorine or chlorine ions may be used in the first etching process. In an example, a plasma source gas may be one or more gases selected from a group comprising $NF_3$, $C_2F_6$, $CF_4$, $CHF_3$, $C_2HF_5$, $SF_6$, $Cl_3$, and $BCl_3$, but it is not limited thereto.

Figure 7C:
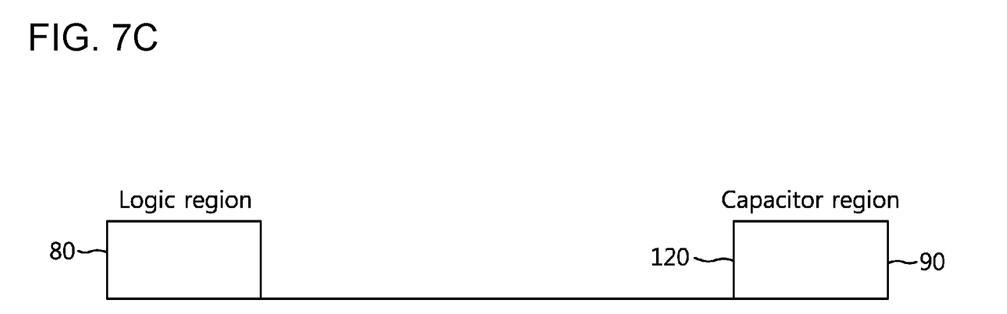

Referring to FIG. 7C, the PR mask pattern 60 (or hard mask pattern) may be removed, and then the top electrode 90 having a sharp top corner may be exposed.

Figure 7D:
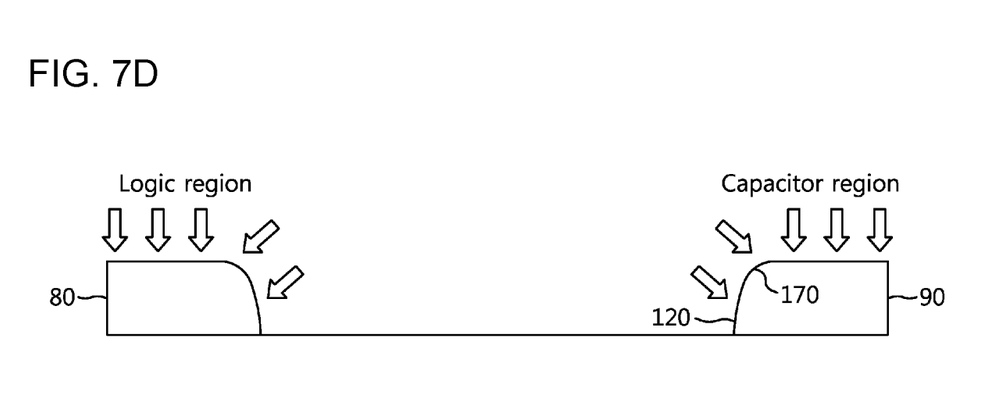

Referring to FIG. 7D, a second etching process may be performed to smooth the sharp top corner of top electrode 90. Unlike the first etching process, the second etching process may implement a sputter etching process rather than the RIE. The sputter etching process may implement inactive plasma source ions. In an example, inactive plasma source ions may be one or more gases selected from a group composed of Ar, Ge, He and N2, but it is not limited thereto. After performing the second etching process, the top electrode 90 may have rounded top corner 120.

According to the disclosure, a breakdown voltage may be high as an electrical field is dispersed because a top corner of a top electrode may be formed to be rounding or sloping in a semiconductor device including a digital isolator capacitor structure.

Accordingly, without changing a size of a digital isolator, a high characteristic of a withstand voltage may be obtained. Further, although a size of a digital isolator may be reduced, a withstand characteristic may be equal.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device manufacturing method, the method comprising:
   providing a logic region and a capacitor region on a substrate;
   forming a pre-metal dielectric film on the substrate;
   forming a first metal line on the pre-metal dielectric film in the logic region; forming a first inter-metal dielectric film on the first metal line;
   simultaneously forming a second metal line and a bottom electrode on the first inter- metal dielectric film; forming a second inter-metal dielectric film on the second metal line and the bottom electrode;
forming a third metal line on the second inter-metal dielectric film in the logic region;
forming a third inter-metal dielectric film on the third metal line;
forming a top metal layer on the third inter-metal dielectric film;
patterning the top metal layer to simultaneously form a top metal line in the logic region and a top electrode in the capacitor region;
forming a first passivation film having a first thickness on the top metal line and the top electrode;
performing a chemical mechanical polishing (CMP) process to flatten the first passivation film;
performing a first etch-back process to etch the first passivation film, the top metal line, and the top electrode;
performing a second etch-back process, affer exposure of the top metal line and the top electrode, to etch the first passivation film, the exposed top metal line, and the exposed top electrode to:
round or slope top comers of the top metal line and the top electrode, and
reduce the thickness of the first passivation film to a second thickness that is less than the first thickness; and
forming a second passivation film over the reduced first passivation film, the top metal line, and the top electrode,
wherein the second passivation film is in direct contact with the rounded or sloped top corners of the top metal line and the top electrode.

2. The method of claim 1, wherein the second passivation film is in direct contact with a top surface of the reduced first passivation film.

3. The method of claim 2, wherein the capacitor region comprises the bottom electrode and the top electrode,
wherein the logic region comprises the first metal line, the second metal line, the third metal line, and the top metal line, and
wherein each of the first metal line, the second metal line, and the third metal line is formed to have a sharp top corner.

4. The method of claim 1,
wherein the first passivation film is formed by SiO$_2$ and the second passivation film is formed by SiN.

5. The method of claim 1, wherein the second passivation film is in direct contact with the top metal line, the top electrode, and the reduced first passivation film.

6. A semiconductor device manufacturing method, the method comprising:
providing a logic region and a capacitor region on a substrate;
forming a pre-metal dielectric film on the substrate;
forming a first metal line on the pre-metal dielectric film in the logic region; forming a first inter-metal dielectric film on the first metal line;
forming a second metal line and a bottom electrode on the first inter-metal dielectric film;
forming a second inter-metal dielectric film on the second metal line and the bottom electrode;
forming a top metal layer on the second inter-metal dielectric film;
patterning the top metal layer to simultaneously form a top metal line in the logic region and a top electrode in the capacitor region;
forming a first passivation film having a first thickness on the top metal line and the top electrode;
performing a chemical mechanical polishing (CMP) process on the first passivation film to flatten the first passivation film;
performing a first etch-back process to etch the first passivation film, the top metal line, and the top electrode;
performing a second etch-back process, affer exposure of the top metal line and the top electrode, to etch the first passivation film, the exposed top metal line, and the exposed top electrode to:
round or slope top comers of the top metal line and the top electrode, and
reduce the thickness of the first passivation film to a second thickness that is less than the first thickness; and
forming a second passivation film over the reduced first passivation film, the top metal line, and the top electrode,
wherein the second passivation film is in direct contact with the rounded or sloped top corners of the top metal line and the top electrode, and
wherein the first passivation film is formed by SiO$_2$ and the second passivation film is formed by SiN.

7. The method of claim 6, wherein the capacitor region comprises the bottom electrode and the top electrode,
wherein the logic region comprises the first metal line, the second metal line, the third metal line, and the top metal line, and
wherein each of the first metal line and the second metal line is formed to have a sharp top corner.

8. The method of claim 6, wherein the second passivation film is in direct contact with a top surface of the reduced first passivation film.

9. The method of claim 6, wherein the second passivation film is in direct contact with the top metal line, the top electrode, and the reduced first passivation film.

10. The method of claim 6, wherein the top electrode is in direct contact with the reduced first passivation film and the second passivation film.

11. A method of manufacturing a semiconductor device, the method comprising:
providing a logic region and a capacitor region on a substrate;
forming a pre-metal dielectric film on the substrate;
forming a first metal line on the pre-metal dielectric film in the logic region;
forming a first inter-metal dielectric film on the first metal line;
forming a second metal line and a bottom electrode on the first inter-metal dielectric film;
forming a second inter-metal dielectric film on the second metal line and the bottom electrode;
forming a top metal layer on the second inter-metal dielectric film;
patterning the top metal layer to simultaneously form a top metal line in the logic region and a top electrode in the capacitor region;
forming a first passivation film having a first thickness on the top metal line and the top electrode;
performing a chemical mechanical polishing (CMP) process on the first passivation film to flatten the first passivation film;
performing a first etch-back process to etch the first passivation film, the top metal line, and the top electrode;

performing a second etch-back process, after exposure of the top metal line and the top electrode, to etch the first passivation film, the exposed top metal line, and the exposed top electrode to:
  round or slope top corners of the top metal line and the top electrode, and
  reduce the thickness of the first passivation film to a second thickness that is less than the first thickness; and
forming a second passivation film over the reduced first passivation film, the top metal line, and the top electrode,
  wherein the second passivation film is in direct contact with the rounded or sloped top corners of the top metal line and the top electrode.

12. The method of claim 11, wherein the second passivation film is in direct contact with the top metal line, the top electrode, and the reduced first passivation film.

13. The method of claim 11, wherein the top electrode is in direct contact with the reduced first passivation film and the second passivation film.

14. The method of claim 11, wherein the top metal line is in direct contact with the reduced first passivation film and the second passivation film.

15. The method of claim 11, wherein the first passivation film is formed by SiO2 and the second passivation film is formed by SiN.

* * * * *